(12) United States Patent
Graham et al.

(10) Patent No.: US 8,803,536 B2
(45) Date of Patent: Aug. 12, 2014

(54) DETECTOR RESPONSIVE TO INTERACTIONS OF VARYING INTENSITY

(75) Inventors: Mark Andrew Graham, Middlesborough (GB); David Lussey, Tunstall (GB)

(73) Assignee: Peratech Limited, Brompton on Swale, Richmond (GB)

( * ) Notice: Subject to any disclaimer, the term of this patent is extended or adjusted under 35 U.S.C. 154(b) by 280 days.

(21) Appl. No.: 13/247,020

(22) Filed: Sep. 28, 2011

(65) Prior Publication Data

US 2012/0074966 A1 Mar. 29, 2012

(30) Foreign Application Priority Data

Sep. 29, 2010 (GB) .................................. 1016329.3
Sep. 29, 2010 (GB) .................................. 1016330.1

(51) Int. Cl.
*G01R 27/08* (2006.01)

(52) U.S. Cl.
USPC .............................. 324/693; 345/173; 338/47

(58) Field of Classification Search
USPC ............... 324/661, 691, 693, 702; 360/324.2, 360/313; 29/593, 592.1
See application file for complete search history.

(56) References Cited

U.S. PATENT DOCUMENTS

| | | | |
|---|---|---|---|
| 4,301,337 A | 11/1981 | Eventoff | |
| 4,315,238 A | 2/1982 | Eventoff | |
| 6,049,080 A | 4/2000 | Ito | |
| 6,505,521 B1 | 1/2003 | Petri et al. | |
| 2002/0126100 A1* | 9/2002 | Sandbach | 345/173 |
| 2005/0134293 A1* | 6/2005 | Sergoyan et al. | 324/662 |
| 2005/0140368 A1* | 6/2005 | Freedman | 324/303 |
| 2006/0187214 A1* | 8/2006 | Gillespie et al. | 345/173 |
| 2006/0255903 A1* | 11/2006 | Lussey et al. | 338/47 |
| 2006/0260411 A1* | 11/2006 | Fortin et al. | 73/756 |
| 2007/0247443 A1* | 10/2007 | Philipp | 345/173 |
| 2008/0027585 A1* | 1/2008 | Wesquet et al. | 700/283 |
| 2009/0217711 A1* | 9/2009 | May | 68/12.04 |

FOREIGN PATENT DOCUMENTS

| | | |
|---|---|---|
| GB | 2367135 A | 3/2002 |
| GB | 2432218 A | 5/2007 |
| JP | 02085766 A | 3/1990 |
| JP | 2007178256 A | 7/2007 |

* cited by examiner

*Primary Examiner* — Arleen M Vazquez
*Assistant Examiner* — Brent J Andrews
(74) *Attorney, Agent, or Firm* — Arthur Jacob

(57) ABSTRACT

A detector comprising control circuitry and a sensor in which the detector comprises three layers. The first layer includes a first set of mutually connected electrically conducting elements and a second set of mutually connected electrically conducting elements. The third layer comprises an electrically conducting plane, and the second layer extends between the first and third layers. The electrical conductivity of the second layer varies in accordance with variations in the intensity of the interactions. In a first mode, the control circuit applies voltage between the first and third layers to generate a first current through the second layer, and provides a measurement of the first current. In a second mode, the control circuit applies voltage between the first and second sets of electrically conducting elements to generate a second current through the second layer, and provides a measurement of the second current.

21 Claims, 11 Drawing Sheets

| | MODE 1 | MODE 2 |
|---|---|---|
| O/P 851 | 0V | High Z |
| O/P 852 | 5V | 5V |
| O/P 853 | 5V | High Z |
| O/P 854 | High Z | 0V |
| I/P 861 | ↙ | X |
| I/P 862 | X | ↙ |

DETECTOR RESPONSIVE TO INTERACTIONS OF VARYING INTENSITY

CROSS REFERENCE TO RELATED APPLICATIONS

This application claims priority from United Kingdom Patent Applications Numbered 10 16 329.3 and 10 16 330.1, both of which were filed 29 Sep. 2010, the whole contents of which are incorporated herein by reference in their entirety.

BACKGROUND OF THE INVENTION

1. Field of the Invention

The present invention relates to a detector responsive to interactions of variable intensity. The invention also relates to a method of detecting the intensity of interactions.

2. Description of the Related Art

A detector responsive to mechanical interactions of variable intensity is shown in U.S. Pat. No. 6,501,465, in which conducting fabric planes are brought into electrical contact through a separator layer when pressure is applied. Voltages are applied to the conductive layers in order to identify the position of the interaction and a measurement of current provides an indication of the intensity of the interaction due to an applied force, an area of interaction or an applied pressure.

It is known that detectors of this type are reliable in terms of identifying an XY location in a two-dimensional plane but difficulties are encountered in terms of their sensitivity to applied pressure in the Z direction. An enhancement is disclosed in U.S. Pat. No. 6,452,479 where it is possible to control the level of sensitivity and reduce instances of false triggering.

A quantum tunnelling composite is disclosed in U.S. Pat. No. 6,291,568 which exhibits electrically insulating properties until pressure is applied thereto, whereupon the composite becomes conductive. The relationship between the intensity of the applied mechanical interaction and the extent to which the composite becomes conductive may be controlled and experience has shown that this approach provides better accuracy and sensitivity for detecting intensities of applied interactions in the Z direction, compared to conductive planes that are primarily configured for identifying XY position.

The present inventors have experimented with deploying a quantum tunnelling composite for detectors of the aforesaid type and the non-linear properties of the material have been documented. Thus, it is known that a detector may be designed that exhibits high sensitivity to low intensities or alternatively the sensitivity may be reduced such that the range of operation is increased. However, difficulties persist in terms of designing a detector that is sensitive to low intensities, often referred to as a first touch, while at the same time being responsive to a wide range of applied intensities.

BRIEF SUMMARY OF THE INVENTION

According to a first aspect of the present invention there is provided a detector comprising a sensor and a control circuit in which: said sensor is responsive to interactions of varying intensities, and comprises a first layer, a second layer and a third layer, wherein said first layer includes a first set of electrically conducting elements which are mutually connected and a second set of electrically conducting elements which are mutually connected, said third layer comprises an electrically conducting plane, and said second layer extends between said first layer and said third layer and the electrical conductivity of said second layer varies in accordance with variations in the intensity of said interactions; and said control circuit is configured to: in a first mode of operation, apply voltage between said first layer and said third layer to generate a first current through said second layer, and thereby obtain a measurement of a first electrical characteristic which depends upon electrical resistance of said second layer; and in a second mode of operation, apply voltage between said first set of electrically conducting elements and said second set of electrically conducting elements to generate a second current through said second layer, and thereby obtain a measurement of a second electrical characteristic which depends upon electrical resistance of said second layer.

In an embodiment, the detector is responsive to mechanical interactions, such as the application of force or pressure. However, the detector may also be responsible to interactions caused by the presence of chemicals, electromagnetic fields or in response to the presence of ionising radiation.

The first mode of operation provides a "first touch" response which may be responsive to relatively low levels of interactions and in some applications may provide a warning to the effect that an interaction is about to take place. Upon entering the second mode of operation, the level of the interaction may be measured over a substantial larger range.

In an embodiment, the first mutually connected elements are interdigitated between said second mutually connected elements.

According to a second aspect of the present invention, there is provided a method of detecting the intensity of interactions using a sensor responsive to interactions of varying intensities and comprising a first layer, a second layer and a third layer, wherein said first layer includes a first set of electrically conducting elements which are mutually connected and a second set of electrically conducting elements which are mutually connected, said third layer comprises an electrically conducting plane, and said second layer extends between said first layer and said third layer and the electrical conductivity of said second layer varies in accordance with variations in the intensity of said interactions, wherein said method comprises: a first mode of operation comprising applying a voltage between said first layer and said third layer to generate a first current through said second layer, and measuring said first current; and a second mode of operation comprising applying a voltage between said first set of electrically conducting elements and said second set of electrically conducting elements to generate a second current through said second layer, and measuring said second current.

DETAILED DESCRIPTION OF THE PREFERRED EMBODIMENTS

FIG. 1

Figure 1:
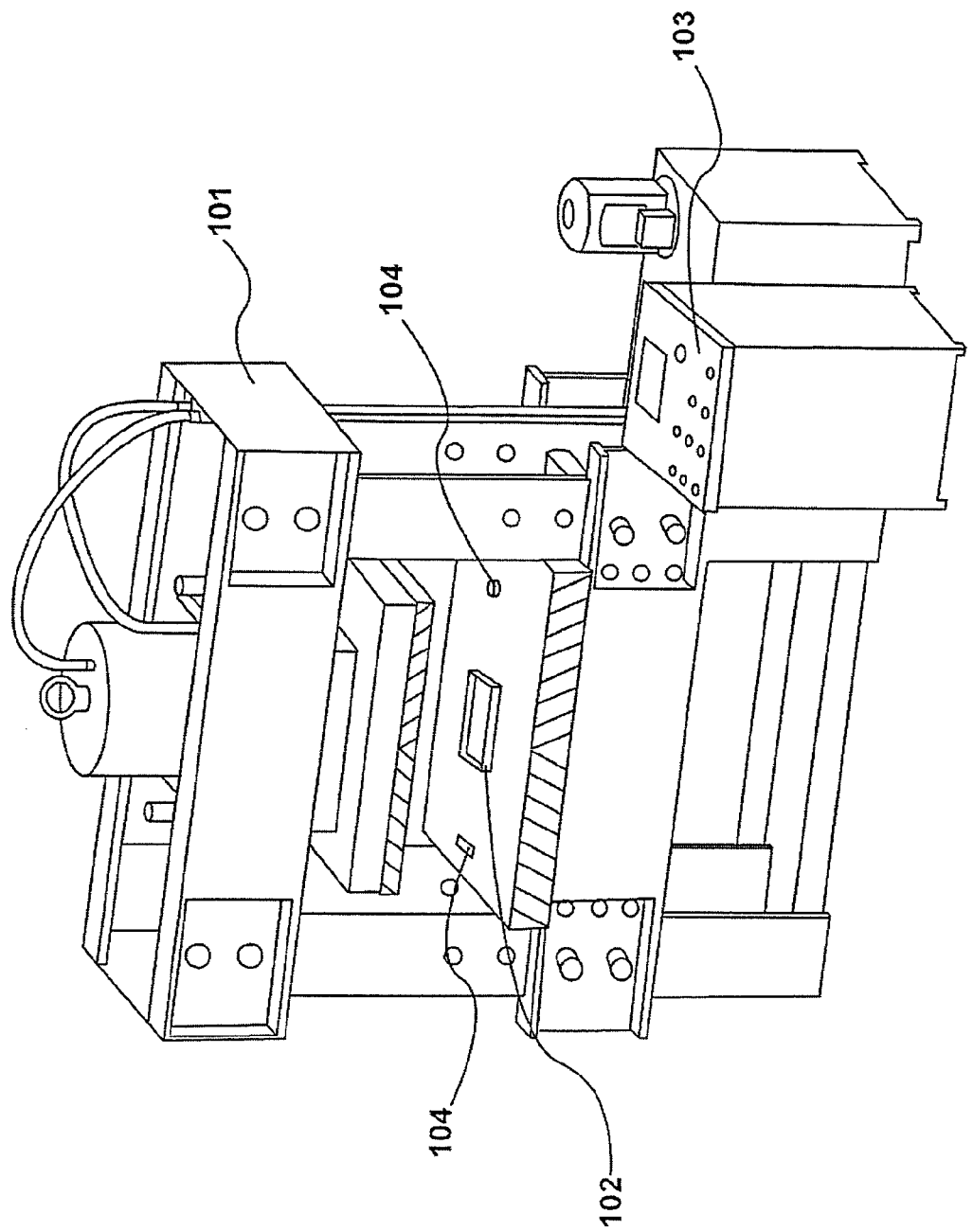
FIG. 1 shows an environment using a pressure sensor.

An environment making use of a pressure detector is illustrated in FIG. 1, in which a press 101 applies force against a work-piece 102 so as to press the work-piece into a desired shape. The press operates with a control system 103 and sensors 104 are included that are configured to experience resistance changes in response to the external pressure being applied. However, in this environment, some work-pieces are relatively delicate and require a modest degree of pressure controlled to a high degree of accuracy. In addition, other work pieces require significant levels of pressure in order to effect the required level of deformation. A difficulty therefore arises in terms of including sensors that are sensitive to low levels of pressure while at the same time are capable of experiencing wide ranges of pressure when high levels of force are being applied.

Sensors are known that have two connections connecting respective interdigitated electrodes. Sensors are also known that have two terminals with a first terminal connected to a top electrode and a second terminal connected to a bottom electrode. The inventors have found that significantly different sensitivities can be achieved with the same pressure sensitive material depending on its method of deployment. If top and bottom electrodes are used a very sensitive sensor results, capable of responding to low forces but having a response that flattens off when high forces are applied. If interdigitated fingers are deployed, a less sensitive sensor is created which is insensitive to low forces but which continues to show a response up to a much higher level of force.

To achieve the benefits of both methods, the inventors investigated options in which a sensor has an interdigitated electrode structure on one side and a single electrode on the other, coated with pressure sensitive material. Such a sensor has three terminals, one to either side of the interdigitated electrodes and one to the single electrode behind the pressure sensitive material. The sensor could then be read in one of three ways; and the present invention is directed towards two of these three modes of operation. In a first, the interdigitated electrodes are combined and a measurement is taken between one side and the other. Thus, in this first mode of operation, the interdigitated electrodes are combined together to effectively form a single electrode.

In a second mode of operation, measurements are taken between interdigitated electrodes.

The third mode of operation involves combining one interdigitated electrode with the single electrode and taking a reading from the second interdigitated electrode. This approach is detailed in co-pending patent application (GB 10 16 329.3) filed in the name of the present applicant.

In the present preferred embodiment, an electronic system is connected to the sensor which multiplexes between the aforesaid first mode of operation and the second mode of operation.

It has also been suggested that in an alternative embodiment, it would be possible to print quantum tunnelling composition ink over the interdigitated electrodes which would form a parallel resistance between the interdigitated electrodes. In this embodiment, at rest, the sensor would read the sheet resistance of the quantum tunnelling composite between the fingers, that would then drop as the additional path (up to the single electrode and down again) lowered the resistance. In this mode of operation, a level of reassurance is provided to the effect that the sensor is operational which may be beneficial in safety applications for example.

An example of quantum tunnelling composition ink is disclosed in U.S. patent application Ser. No. 12/547,855 published as United States patent publication US 2010/0062148, assigned to the present applicant.

FIG. 2

Figure 2:
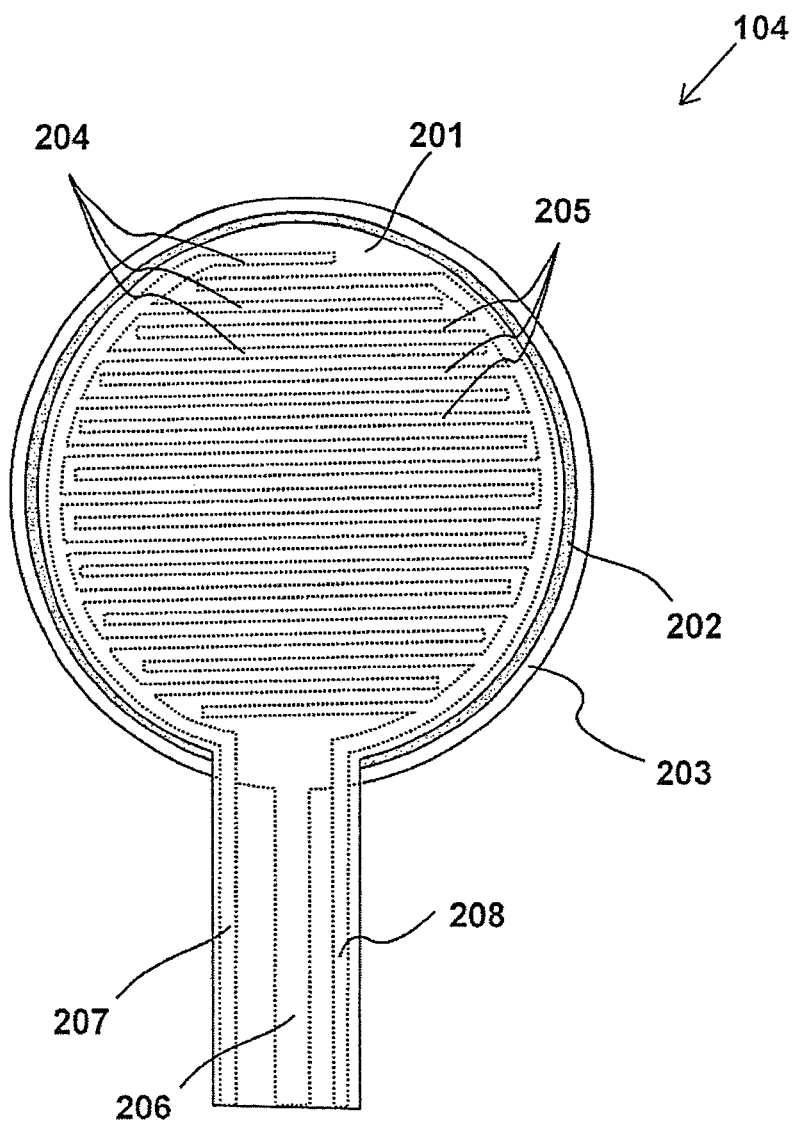
FIG. 2 shows a plan view of the sensor identified in FIG. 1.

A plan view of a sensor 104 is detailed in FIG. 2. Outer protecting layers have been removed and in this example, the sensor is shown from its underside. Thus, there is provided a first layer 201, a second layer 202 and a third layer (the upper layer) 203. The first layer 201 includes first mutually connected electrically conductive elements 204 and second mutually connected electrically conductive elements 205. These mutually connected elements 204 and 205 preferably take the form of interdigitated fingers such that each adjacent finger belongs to the alternative set of elements. That is, the interdigitated fingers extend along the first layer 201 in a first direction, and in a second opposite direction along the first layer, the fingers alternate between the first mutually connected electrically conductive elements 204 and second mutually connected electrically conductive elements 205.

In an embodiment, the first layer 201 includes an electrically insulating supporting substrate and the first mutually connected elements 204 and the second mutually connected elements 205 are formed of an electrically conductive material that is adhered to the substrate. In an embodiment the elements 204 and 205 are formed of conductive carbon supported on the substrate, while in other embodiments the elements 204 and 205 are metallic, typically being formed by printing silver loaded ink.

The second layer 202 has an electrical conductivity that varies in accordance with variations to the intensity of applied mechanical interactions. In a preferred embodiment, the material of the second layer comprises or consists of a quantum tunnelling composition, such as that produced by the present applicant and sold under the trademark QTC. A preferred quantum tunnelling composition has a relatively high resistance when no force is applied. Resistivity reduces (i.e. conductivity increases) when pressure is applied and as such it is possible to determine the level of applied pressure by measuring current (in amps) in response to an applied electromotive force (in volts).

The third layer 203 consists of an electrically conducting plate and is connected to a first electrode 206. Similarly, the first mutually connected elements 204 are connected to a second electrode 207 and the second mutually connected elements 205 are in turn connected to a third electrode 208. In an embodiment, the sensor as a whole has a diameter substantially similar to that of a typical (one Euro) coin.

FIG. 3

Figure 3:
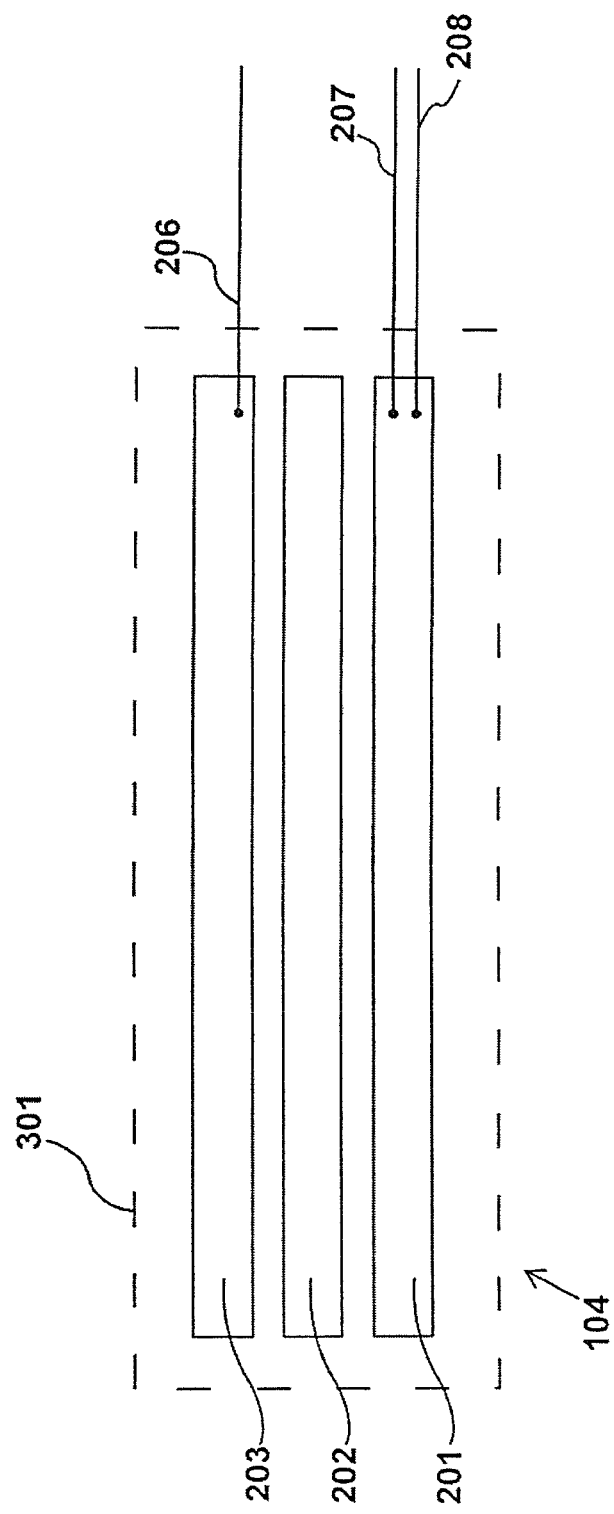
FIG. 3 shows a side view of the sensor identified in FIG. 1.

A schematic side view of sensor 104 is illustrated in FIG. 3. The sensor 104 is protected by a surrounding sheath 301 within which are contained the first layer 201, the second pressure sensitive layer 202 and a third conducting layer 203. Electrodes 206, 207 and 208 extend from the protective sheath 301.

For the purposes of clarity, the three layers 201, 202 and 203 are shown spaced apart in FIG. 3. However, it should be understood that in reality the central second layer is in mutual contact with both of the outer layers (i.e. first layer 201 and thirds layer 203).

In an embodiment, pressure is applied to the top layer 203 and the bottom layer 201 resulting in the resistance of the intermediate layer 202 changing. However, with this configuration, there are two ways of measuring the change in resistance, as detailed with respect to FIG. 4.

Figure 4A:
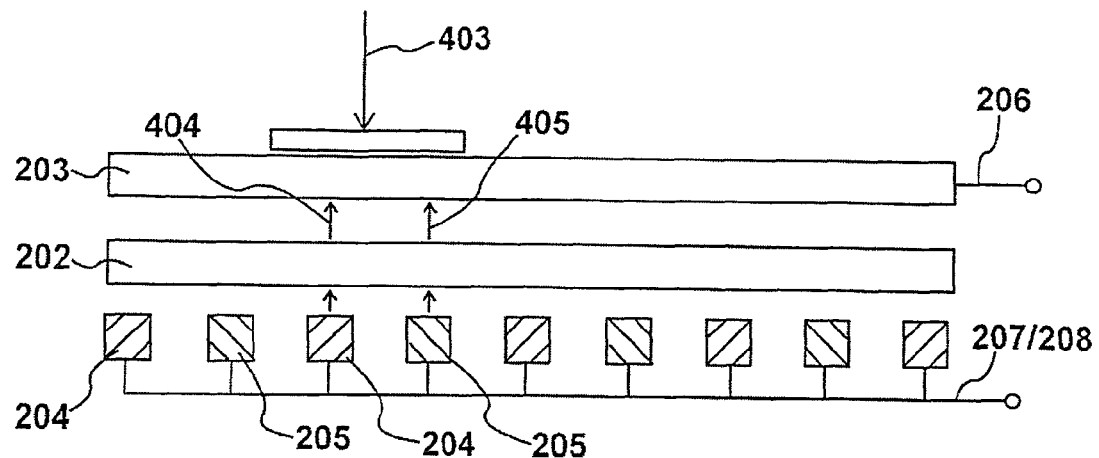
FIGS. 4A and 4B show a diagrammatic representation of the sensor of FIG. 1 operating in a first mode and a second mode respectively.
Figure 4B:
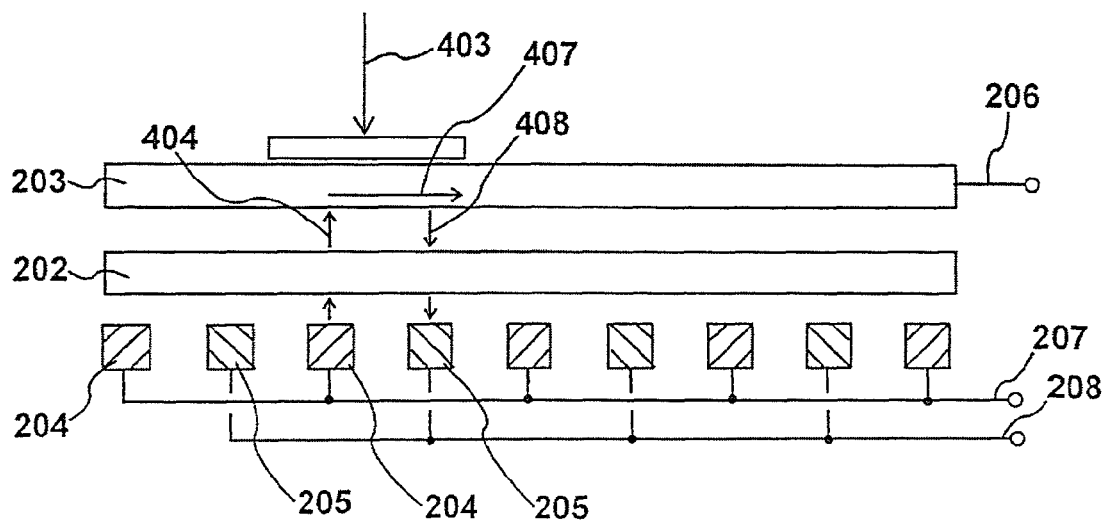

FIGS. 4A and 4B

Diagrammatic representations of the sensor of FIGS. 2 and 3 are shown in FIGS. 4A and 4B.

FIG. 4A illustrates a first mode of operation in which manual pressure, illustrated by arrow 403, is applied to the top electrode 203. Electrodes 207 and 208 have been combined in parallel, as illustrated as 207/208. Thus, there is effectively an electrode at the top (203) and a second electrode (formed of the two sets of interdigitated fingers 204 and 205) at the bottom with pressure sensitive material 202 sandwiched in between.

In operation, a voltage is applied across electrode 206 and the combined electrodes 207/208. As a voltage is applied, changes to the resulting current are detected due to varying changes in resistance. As pressure is applied, current flows from electrode 206, through conducting elements 204 and 205 and through the intermediate layer 202 so as to be returned via conducting layer 203 and electrode 206. This may be referred to as a first mode of operation, in which current flows from elements 204 to layer 203, as illustrated by arrow 404 and current also flows from an element 205 to layer 203, as illustrated by arrow 405.

FIG. 4B illustrates an alternative second mode of operation, in which electrode 206 is ignored and a voltage is applied across electrode 207 and electrode 208. As pressure 403 is applied, intermediate layer 202 becomes conductive, resulting in a current flowing from an element 204 and through intermediate layer 202, as illustrated by arrow 406. The current now flows through conducting layer 203 as illustrated by arrow 407. It then returns to element 205, through intermediate layer 202, as illustrated by arrow 408.

The inventors have discovered that the first mode of operation (shown in FIG. 4A) produces different force/resistance profiles compared to the second mode of operation (shown in FIG. 4B) because the first mode defines one variable resistance, whereas the second mode provides for two. Thus, different paths are taken therefore there are different resistance profiles.

The present invention seeks to combine these approaches such that the device is capable of operating in a first mode that provides a steep response curve because the current path only goes through the variable material once. In the second mode, the current goes through the variable material twice, with a reduced area of contact. This results in a shallow and longer response but with the second approach the initial response (the so called "first touch") is not good and may not be measurable until a significant level of pressure has been applied.

In the examples shown, the interdigitated fingers provide a bottom layer 201 and it is then possible to print the pressure sensitive material (used to form layer 202) onto the underside layer of the top electrode 203 or over the interdigitated fingers 201. When printed over the interdigitated fingers, a resistance path will exist between these fingers and the resulting continually flowing current may be used to provide a reassurance to the effect that the sensor is operational. Such an approach may be desirable when safety is an issue, such as when used for airbags in motor vehicles for example.

Figure 5A:
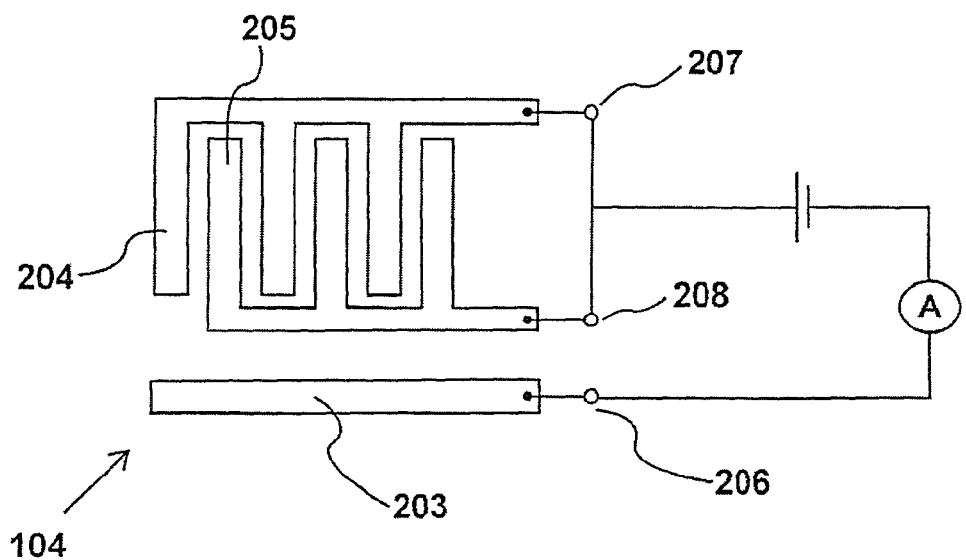
FIGS. 5A and 5B show a schematic representation of a sensor 104 configured for a first mode of operation, and a respective response curve 502.
Figure 5B:
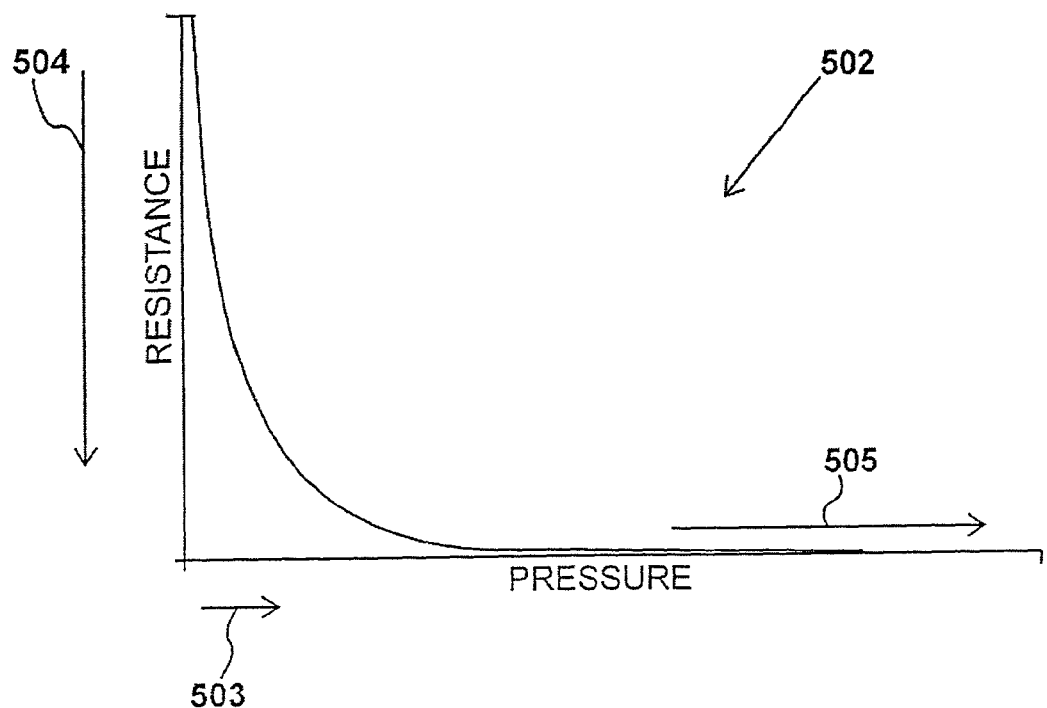

FIGS. 5A and 5B

A schematic representation of a sensor 104 configured for the first mode of operation is illustrated in FIG. 5A with its resulting response curve 502 illustrated in FIG. 5B. As shown in FIG. 5A, electrodes 207 and 208 are combined in parallel such that, electrically, they present a unified plane 201 with current flowing to plane 203 via the intermediate layer 202, as illustrated in FIG. 4A.

As illustrated by the response curve 502, the application of a relatively modest degree of pressure 503 results in a dramatic reduction in resistance as shown at 504. Thus, in this configuration, the sensor 104 is sensitive to low levels of pressure. However, having quickly made use of the available resistance range, further increases in pressure (as illustrated by arrow 505) have minimal effect upon changes in resistance. Thus, for high levels of pressure the sensor in this mode of operation is not particularly useful.

Figure 6A:
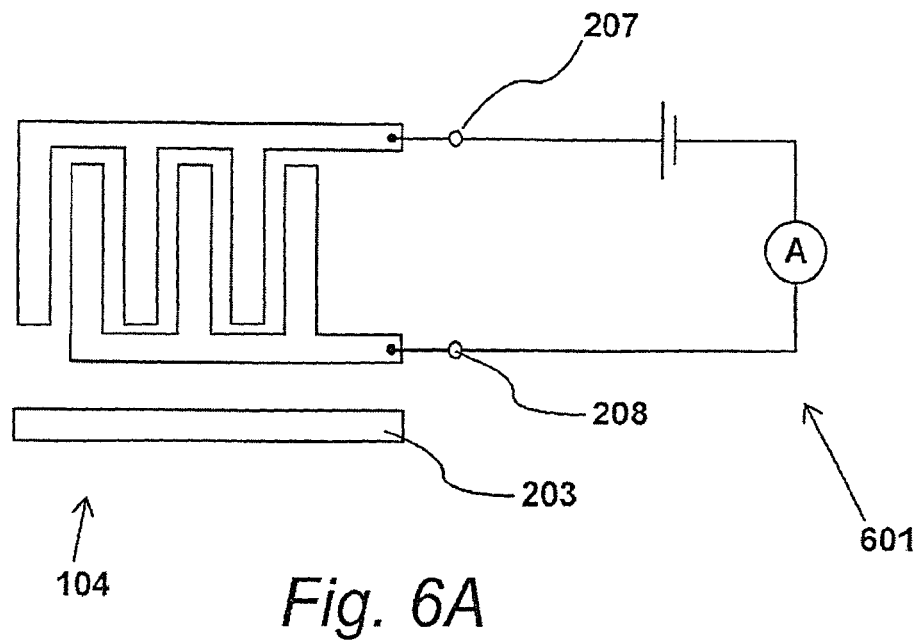
FIGS. 6A and 6B show a configuration of a sensor 104 for operation in a second mode, and a respective response curve 602.
Figure 6B:
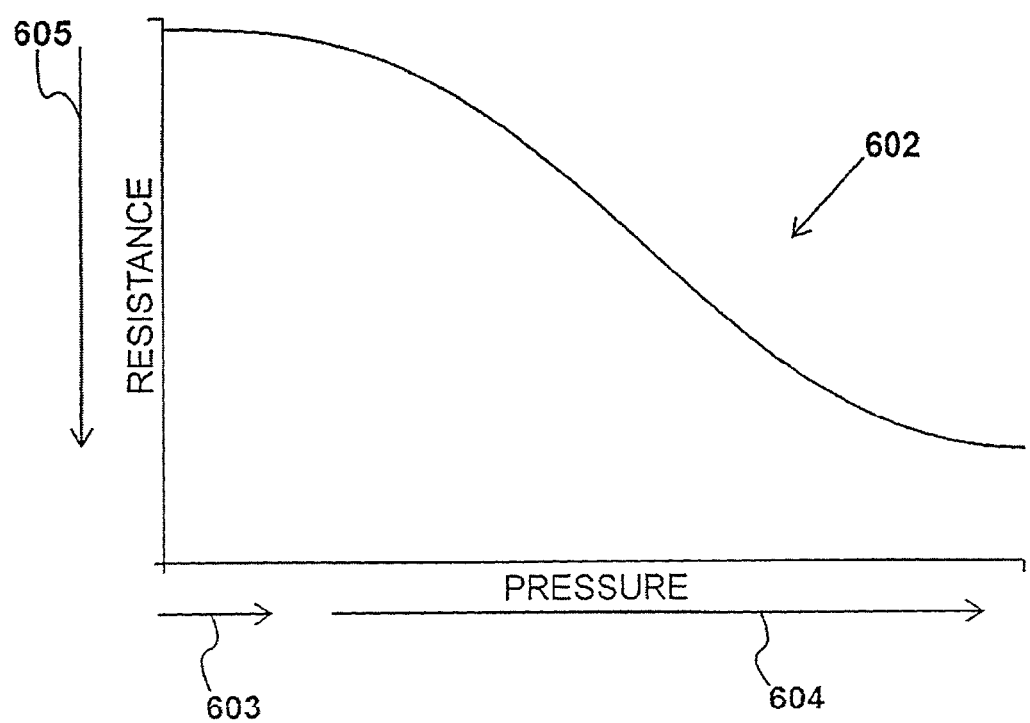

FIGS. 6A and 6B

Operation of the sensor 104 in the second mode is illustrated in FIGS. 6A and 6B. A diagrammatic representation of the circuit is shown in FIG. 6A with the resulting response curve 602 shown in FIG. 6B. In this example, following the application of pressure, current flows from electrode 207 and then returns via electrode 208 in a manner substantially similar to that described with reference to FIG. 4B.

As Illustrated in FIG. 6B, the response curve is dramatically different from that illustrated in FIG. 5B. In particular, an initial pressure, shown at 603, has very little effect in terms of changes to resistance. However, for higher pressures, shown at 604, useful changes to resistance do occur, as illustrated at 605.

Figure 7A:
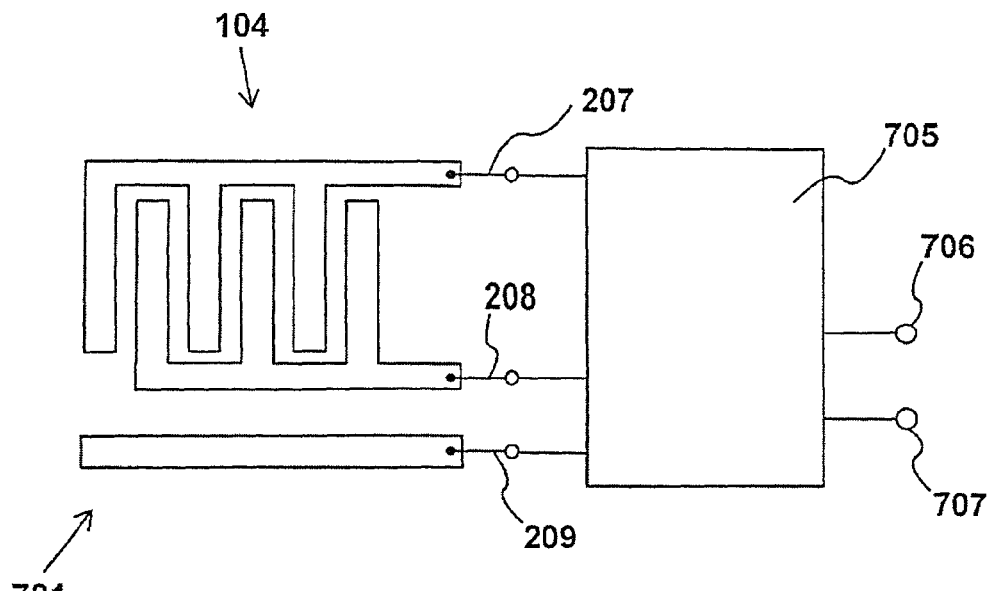
FIGS. 7A and 7B show a sensor communicating with a control system 705, and a respective response curve 702.
Figure 7B:
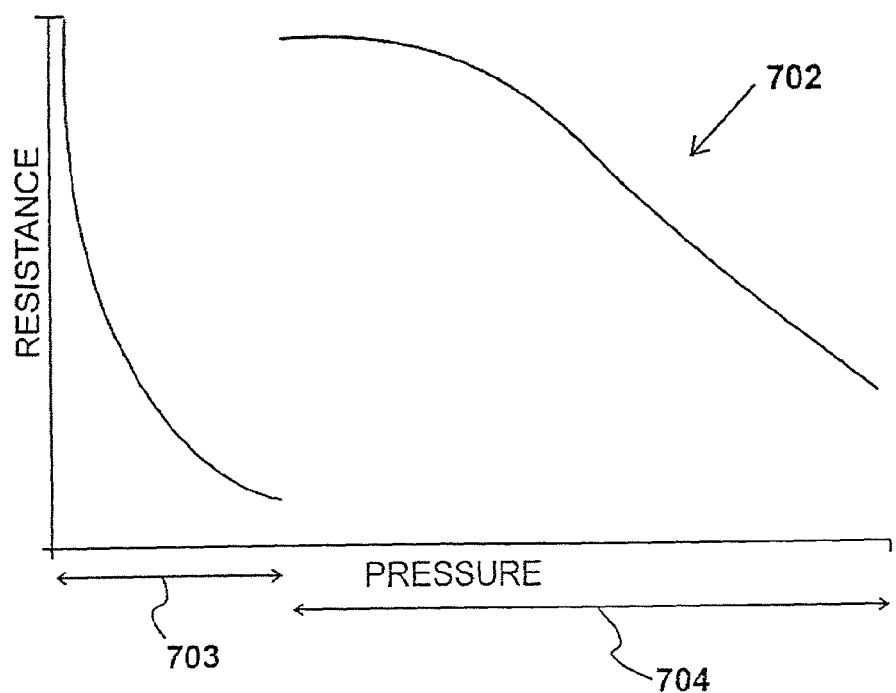

FIGS. 7A and 7B

A detector 701 is shown in FIG. 7A that is responsive to mechanical interactions of variable intensity, in which an output signal varies in a substantially non-linear way with respect to the intensity of the mechanical interaction. The response curve 702 resulting from the detector 701 is shown in FIG. 7B.

In a first mode of operation, the detector 701 has a first response that is sensitive to an initial first range of intensities 703. In addition, the detector 701 has a second mode of operation that is less sensitive over said first initial range 703 but provides a varying output over a second range 704 that is substantially greater than said first range.

The detector 701 comprises the sensor 104 and a control system 705 connected to each of electrodes 206, 208 and 207 of the sensor 104. The control circuit 705 is therefore capable of performing a method of detecting the intensity of an interaction using a material that has an electrical property that varies with respect to the extent of said interaction.

A control system 705 allows the detector to operate in a first mode of operation that has a first response that is sensitive to an initial first range 703 of intensities of interactions. In addition, the control system 705 is capable of performing a switching operation to a second mode of operation that has a second response that is less sensitive over said first initial range 703 of intensities but provides a varying output over a second range 704 of higher intensities.

In the preferred embodiment described herein, the interactions take the form of mechanical interactions, typically due to the application of force or pressure. However, sensors of this type may also be responsive to the presence of chemicals in which the first mode of operation detects the presence of a chemical which may, for example, provide a warning to the effect that a dangerous chemical is present in the atmosphere. As the intensity and concentration of the chemical increases, it is possible to switch to the second mode of operation, thereby providing a mechanism for monitoring the concentration of the chemical. These levels of concentration may represent fatal levels of concentration for which monitoring is still required and, hopefully, personnel will have been removed when very low concentrations were detected during the first mode of operation.

Sensors of this type are also sensitive to the presence of electromagnetic radiation, such as radio waves and microwaves etc and to the presence of ionising radiation.

As illustrated with respect to FIG. 2, the first layer of the sensor preferably has a first set of conductive elements (204) that are interdigitated between a second set of conductive elements (205). Furthermore, in an embodiment, in the first mode of operation the first set of conductive elements are electrically connected to the second conductive elements to present a unified plane. Thus, in this first mode of operation, control system 705 effectively forces the sensor to operate in the manner described with respect to FIG. 5A. However, in the second mode of operation, the first set of conductive elements and the second set of conductive elements are made electrically distinct, such that the control system 705 forces the sensor to operate in a manner substantially similar to that described with respect to FIG. 6A.

The control system 705 also includes output terminals 706 and 707. Output terminal 706 may be used to provide signals to indicators and measuring devices showing the level of applied pressure to an operator. Output terminal 707 may be used to produce automatic control signals either to control the extent to which a machine is operating or in order to produce an alarm condition and/or a machine shutdown condition.

When used for the detection of dangerous chemical vapours or dangerous levels of radiation, the first mode of operation may be used to detect initial low levels of chemicals/radiation, resulting in the production of an alarm signal, warning personnel to evacuate the area. Thereafter, as levels increase and personnel have been removed from the area, the second mode of operation may be used to produce a measurement of intensities or concentrations etc.

Figures 8A, 8B:
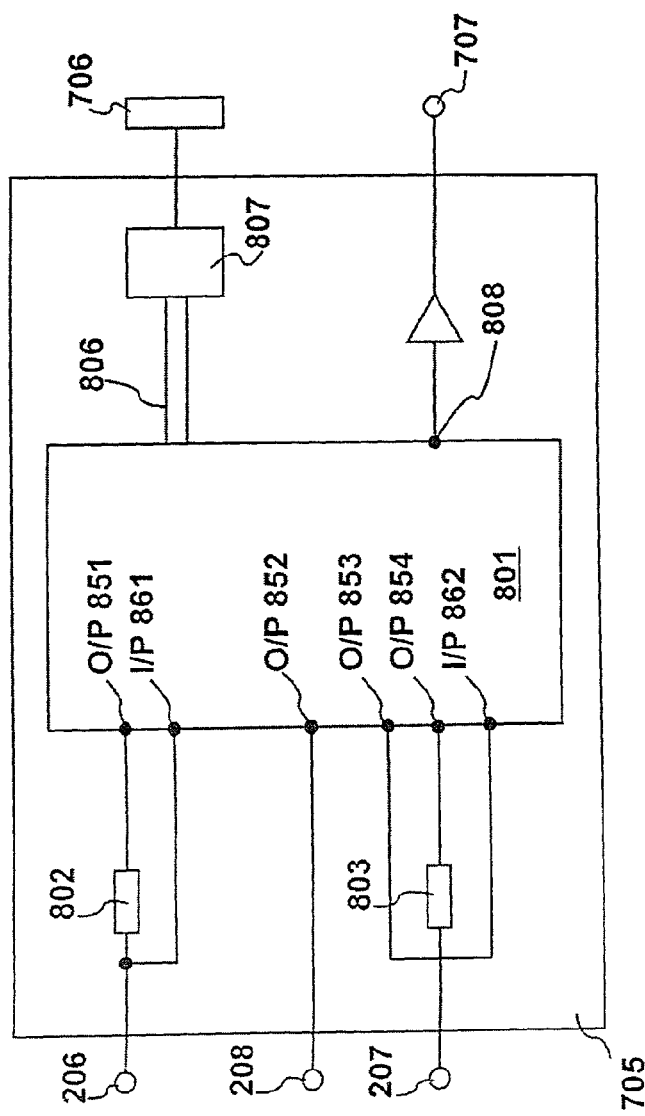
FIGS. 8A and 8B detail the control system of FIG. 7.

FIGS. 5A and 8B

Control system 705 is detailed in FIG. 8B while a table illustrating its two modes of operation is shown in FIG. 8B. The control system includes a programmable processor 801, having a plurality of analog and digital input and output ports.

The processor 801 has a first output port 851 configured to supply a voltage to first electrode 206 of the sensor 104, via a resistor 802. A first input port 861 of the processor 801 is also connected to the resistor 802, but on the sensor side of the resistor.

The processor 801 has a second output port 852 directly connected to third electrode 208 of the sensor 104 for supplying a voltage to that electrode.

A third output port 853 is connected directly to the second electrode 207, while a fourth output port 854 is connected to the second electrode 207 via a second resistor 803. A second input port 862 of the processor 801 is also connected to the resistor 803, but on the sensor side of the resistor.

In a first mode of operation, the fourth output port 854 is not used and so it is set to high impedance such that its value is able to float. i.e. it is placed in a tristate condition.

The output port 851 is set to 0 volts so that the electrode 206 of the sensor 104 is connected to 0 volts via a resistor 802. The output ports 852 and 853 are both set to 5 volts so that the two sets of interdigitated fingers 204 and 205 are supplied with 5 volts and a first current flows from the two sets of interdigitated fingers through the second layer 203 (as described with reference to FIG. 4A) to the electrode 206 and through the resistor 802. The first current thus causes a voltage drop across the resistor 802 and the voltage appearing an input port 861 is proportional to the first current. Thus, by determining the voltage at the input port 861, the processor 801 obtains a measurement of a first characteristic (in this case the first current) that depends upon the electrical resistance of the second layer.

In a second mode of operation, output ports 851 and 853 are not used and so they are set to high impedance such that their value is able to float.

The fourth output port 854 is set to 0 volts so that the second electrode 207, which is connected to one set of the interdigitated fingers 204, is connected to 0 volts via the second resistor 803. The second output port 852 is set to 5 volts so that the third electrode 208, which is connected to the other set of the interdigitated fingers 205, is connected to 5 volts. Consequently, a second current flows from the second output port 852 through third electrode 208 and one set of interdigitated fingers 205, through the second layer 203 (as described with reference to FIG. 4B) to the other set of interdigitated fingers 204 and through resistor 803 to output port 854. The voltage drop across the second resistor 803 is measured by the processor 801 at the second input port 862.

A variable output, in dependence of the values measured at input port 861 in mode 1 or at input port 862 in mode 2, is provided in digital form via digital output port 806. This is supplied to a parallel to serial conversion circuit 807 to provide a serial digital output at 706. An output analog port 808 provides an alarm signal at terminal 707 in dependence of the values measured at input port 862 in mode 2 or at input port in mode 1.

Figure 9:
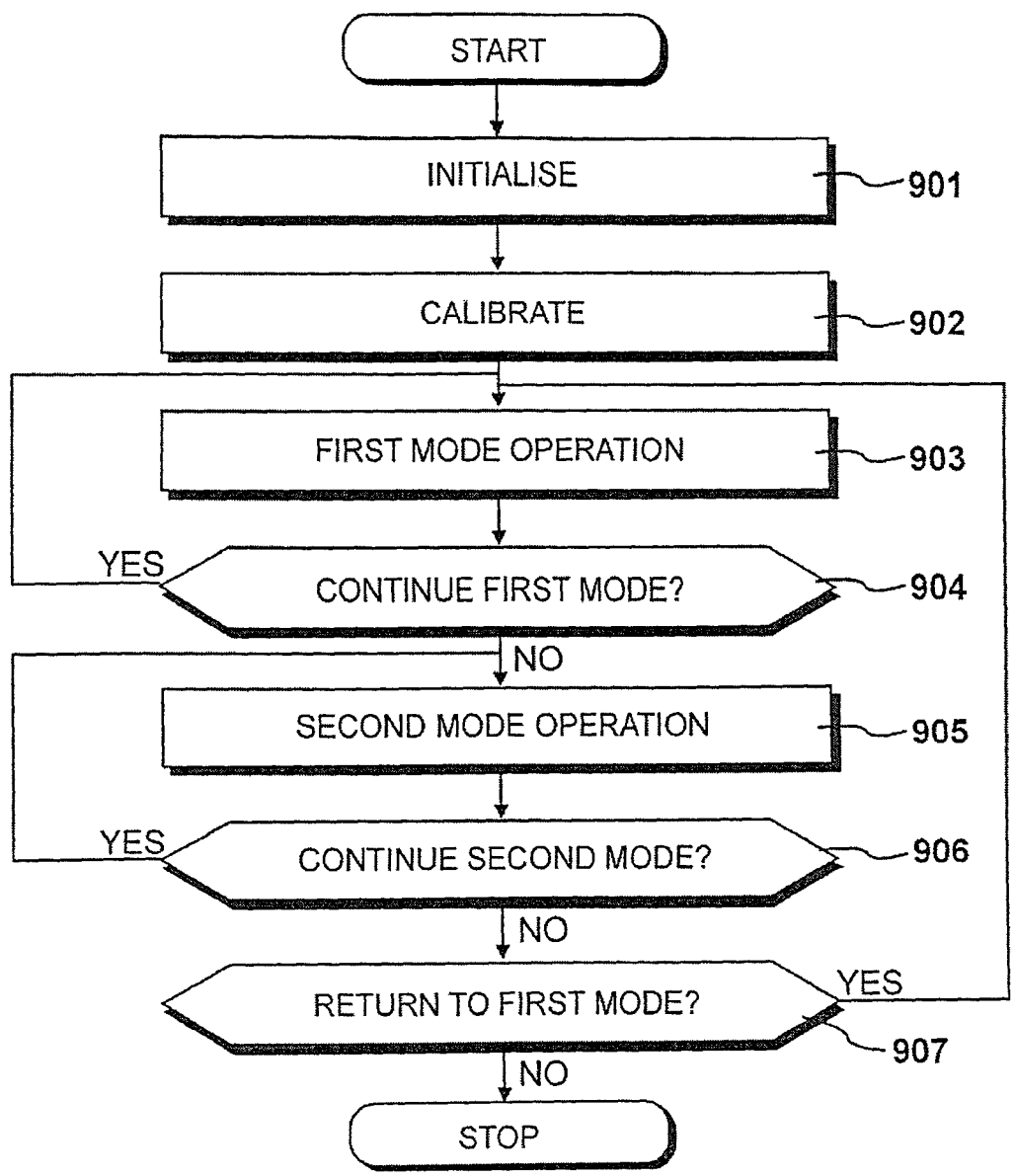
FIG. 9 details operations performed by the control system of FIG. 8.

Operations performed within processor 801 are performed under program control, as illustrated in FIG. 9.

In the embodiment of FIG. 8A, constant voltages are applied in both the first mode and the second mode of operation and the corresponding first and second currents flowing through the second layer are measured, in order to obtain values that are dependent upon an external interaction, such as a force, applied to the sensor 104. However, in an alternative embodiment, the constant voltage supplies are replaced by constant current supplies. i.e. in a first mode of operation, a constant current supply is connected to first electrode 206 and second and third electrodes 207 and 208, which are connected in parallel, and the resulting voltage drop from the first electrode 206 to the second and third electrodes 207 and 208 is measured. Similarly, in a second mode of operation, a constant current supply is connected to second electrode 207 and third electrode 208, and the resulting voltage drop from the second electrode 207 to the third electrode 208 is measured.

In the above described arrangement, direct current (d.c.) electrical supplies are used, however, it should be appreciated that other embodiments are envisaged in which alternating current (a.c.) voltages are supplied to the sensor 104 and an electrical characteristic is measured that depends upon the impedance of the sensor, and not just the resistance of the second layer.

FIG. 9

Following start-up, an initialisation process is performed at steps 901 which may involve the loading of stored instructions to executable memory. This is then followed by a calibration process at step 902 in which input signals are measured in both modes of operation with no load being applied so as to calibrate the device. Further calibration procedures may be performed, possibly by the application of known loads in a predefined sequence.

After calibration, the device enters its first mode of operation at step 903. In this first mode of operation, port 854 is non-operational (being placed into a tristate condition) with outputs being generated at ports 851, 852 and 853 and analog measurement being taken at input port 861.

After an appropriate number of readings have been taken, a question is asked at step 904 as to whether the first mode of operation is to continue. In an embodiment, the system continues to work in its first mode of operation for relatively small loads, as illustrated by pressure range 703. As pressure increases beyond range 703, and the value measured at input port 861 rises above a threshold value, the question asked at step 904 will be answered in the negative such that the second mode of operation is adopted at step 905.

Under the second mode of operation, input port 861 and output port 854 are placed into a tristate condition, an output is generated at ports 852, and 854 and an input is received at the second input port 862.

As the device continues to operate within pressure range 704, the second mode of operation generates measurements resulting in digital output signals being supplied to output port 706 via conversion device 807. If, during the second mode of operation, the measured pressure exceeds a predetermined level, an alarm signal will be generated by analog output port 808.

Having generated a predetermined number of values, a question is asked at step 906 as to whether the second mode of operation is to continue. When answered in the affirmative, control is returned to step 905 and the second mode operation continues resulting in the generation of further measurements.

Eventually, the measured level of pressure will reduce below threshold value at the lower end of the range 704 resulting in the question at step 906 being answered in the negative.

Upon the question at step 906 being answered in the negative, a question is asked at step 907 as to whether operation is to return to the first mode. If answered in the affirmative, the first mode of operation is resumed at step 903. However, if the question asked at step 907 is answered in the negative, usually on the basis that a predetermined number of measurements have been taken, and the question asked at step 907 is also answered in the negative, the process stops.

In an alternative embodiment, the processor 801 is programmed to repeated switch between modes 1 and 2 regardless of the measured currents. Thus it continuously measures a series of values alternating between mode 1 measured at input port 861 and mode 2 measured at input port 862. The switching between modes could be performed rapidly, for example 100 per second.

FIG. 10

Figure 10:
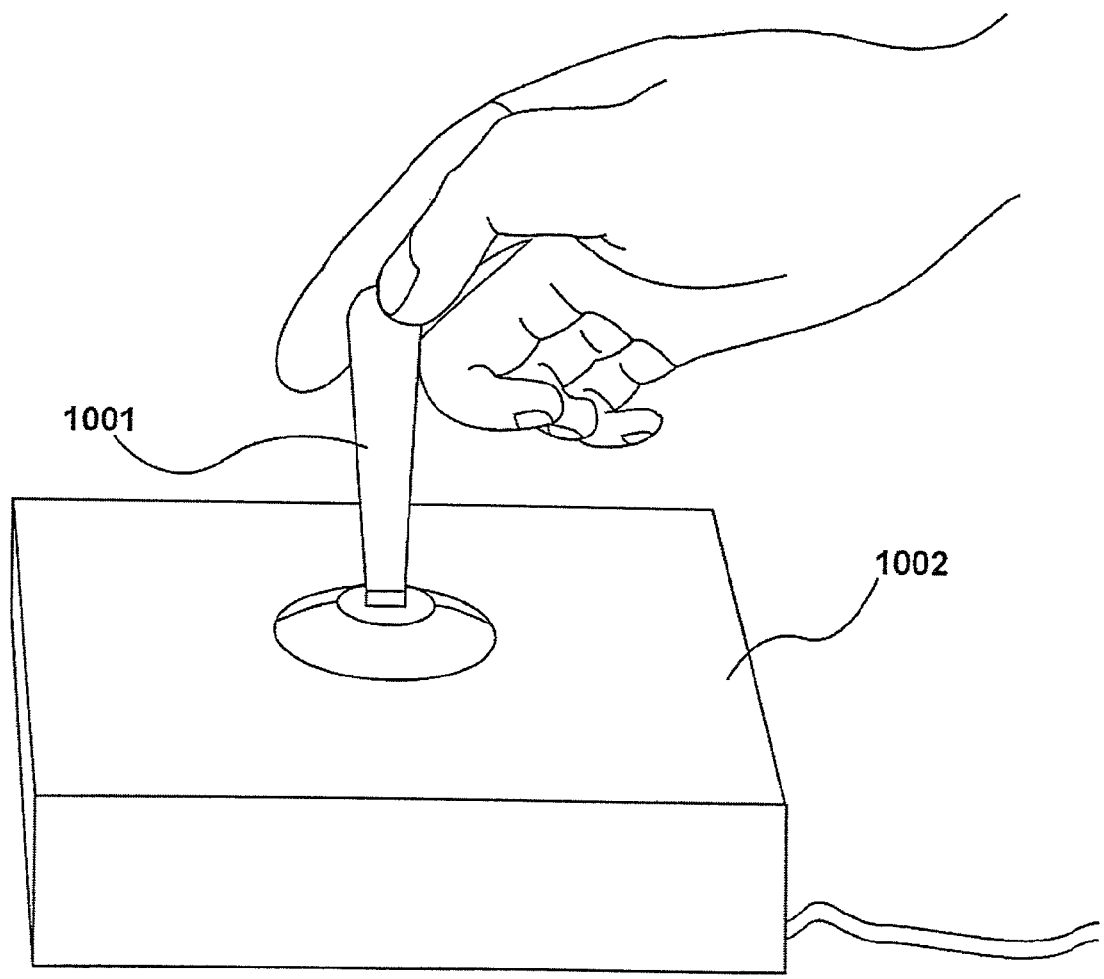
FIG. 10 illustrates an alternative application.

An alternative application for the system described with respect to FIGS. 2 to 9 is illustrated in FIG. 10. In this example, manual pressure is applied to a joystick 1001 constrained within a control mounting 1002. The joystick 1001 could be used to control operations within a game or it could be used to control a device performing a mechanical operation.

In the embodiment, the joystick 1001 is sensitive to relatively soft pressures resulting in its operation taking place within the first mode over range 703. In this mode, operation could be used to control a particular event. However, if substantially larger pressures are applied to the joystick, this will be detected resulting in operation moving to the second mode over range 704. This will change the characteristics of the joystick which may allow the same operation to be performed under different levels of pressure. However, given that the system has detected an alternative mode of operation, it would also be possible for this information to be used within the game such that the nature of the item being controlled could change. In this way, the same input device could be used to control two different aspects of the game or two different mechanical operations, depending upon whether it is used with a light touch or whether it is used with substantial pressure being applied.

Figure 13:
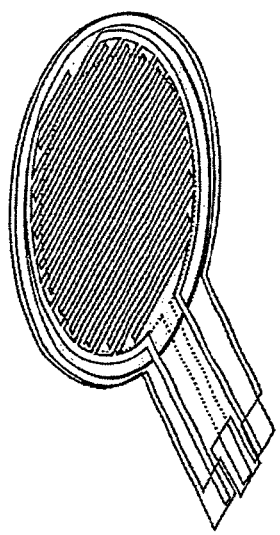
FIGS. 11, 12 and 13 illustrate manufacturing steps for making a sensor similar to sensor 104.
Figure 12:
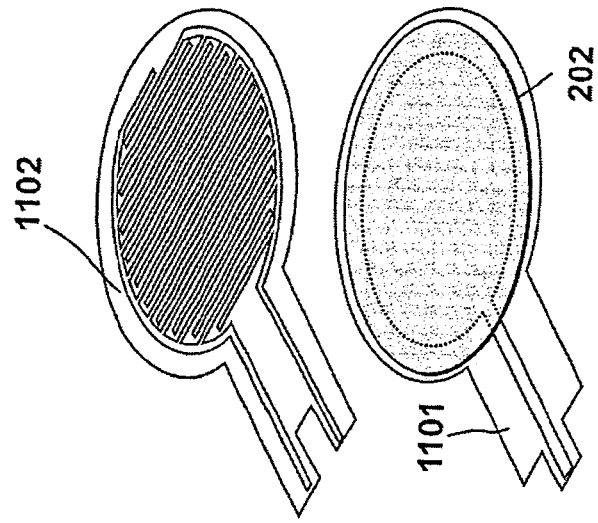
Figure 11:
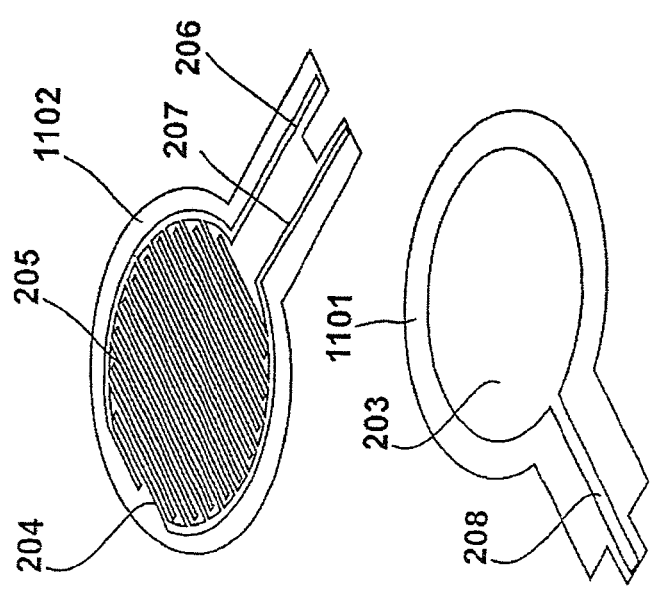

FIGS. 11, 12 and 13

A method of manufacturing an embodiment of sensor 300 is illustrated in FIGS. 11, 12 and 13. Initially a pair of suitably shaped sheets 1101 and 1102 of insulating material is formed as shown in the perspective view of FIG. 11. Typically the sheets are formed of a plastics material, and in the present case they are formed of PTE sheet. (For sensors that are intended to detect airborne chemicals, the sheets are formed from a permeable membrane, for example in one embodiment the sheets are formed from a textile material.) The conducting layer 203 and first electrode 206 are formed on the first sheet 1101 by printing conducting ink, which in the present example comprises silver-loaded ink. Similarly, the interdigitated electrodes 204 and 205 and the second and third electrode 207 and 208 are formed on the second sheet 1102 by printing conducting ink.

When the conducting ink is dry, the first sheet 1101 is coated with quantum tunnelling ink to form the second layer 202. The quantum tunnelling ink comprises particles of a conductive or semi-conductive powdered material dispersed within a polymeric liquid binder. At least some of the particles are spiky or needle shaped to enable quantum tunnelling between particles when a voltage is applied across the layer 302. In the present embodiment, the quantum tunnelling ink is as described within the applicant's co-pending US patent application published as US 2010/0062148, the entire contents of which are incorporated herein by reference. The quantum tunnelling ink used to form the second layer is available from Peratech Limited of the United Kingdom.

As shown in FIG. 12, the conducting layer 203 is covered by the quantum tunnelling ink. The quantum tunnelling ink is dried before the second sheet 1102 is positioned over the first sheet 1101 and the two are brought together so that the interdigitated elements 204 and 205 are brought into contact with the second layer 202 to form the sensor shown in FIG. 13.

In an alternative embodiment, the quantum tunnelling ink is printed onto the second sheet 1102 to form the second layer 202 over the interdigitated electrodes 204 and 205. This is allowed to dry before the conducting layer 203 (on the first sheet 1101) is positioned on the second layer.

The invention claimed is:

1. A detector comprising a sensor and a control circuit in which:
said sensor is responsive to interactions of varying intensities, and comprises a first layer, a second layer and a third layer, wherein
said first layer includes a first set of electrically conducting elements which are mutually connected and a second set of electrically conducting elements which are mutually connected,
said third layer comprises an electrically conducting plane, and
said second layer extends between said first layer and said third layer and the electrical conductivity of said second layer varies in accordance with variations in the intensity of said interactions; and
said control circuit is configured to:
in a first mode of operation, apply voltage between said first layer and said third layer to generate a first current through said second layer, and thereby obtain a measurement of a first electrical characteristic which depends upon electrical resistance of said second layer; and in a second mode of operation, apply voltage between said first set of electrically conducting elements and said second set of electrically conducting elements to generate a second current through said second layer, and thereby obtain a measurement of a second electrical characteristic which depends upon electrical resistance of said second layer; wherein:

when operated in said first mode, said sensor is sensitive to an initial first range of intensities of interactions; and when operated in said second mode, said sensor is less sensitive over said first initial range of intensities but provides a varying output over a second range of intensities that is substantially greater than said first range of intensities.

2. The detector of claim 1, wherein said interactions are of a type selected from the group: mechanical; chemical; electro-magnetic; and ionizing radiation.

3. The detector of claim 1, wherein said second layer comprises a substance that exhibits a variable resistivity and said resistivity is dependent upon pressure applied to said second layer.

4. The detector of claim 3, wherein said substance is a quantum tunnelling composite.

5. The detector of claim 4, wherein said quantum tunnelling composite is not adhered to said first layer so that during operation conduction does not occur between said first mutually connected elements and said second mutually connected elements unless pressure is applied to said second layer.

6. The detector of claim 4, wherein said quantum tunnelling composite is adhered to said first layer so that during operation in said second mode, a residual current flows between said first mutually connected elements and said second mutually connected elements in the absence of applied pressure.

7. The detector of claim 1, wherein:

said first layer includes a supporting substrate; and said first mutually connected elements and said second mutually connected elements include conductive carbon supported on a substrate.

8. The detector of claim 1, wherein said first mutually connected elements are interdigitated between said second mutually connected elements.

9. The detector of claim 1, wherein said control circuit is configured to compare said measurement of said first current to a first threshold value when operating in said first mode, and said control circuit is configured to change to said second mode of operation when said measurement of said first current exceeds said first threshold value.

10. The detector of claim 1, wherein said control circuit is configured to compare said measurement of said second current to a second threshold value when operating in said second mode, and said control circuit is configured to change to said first mode of operation when said measurement of said second current is less than said second threshold value.

11. The detector of claim 1, wherein: constant voltages are applied in said first mode and said second mode; said first electrical characteristic is said first current through said second layer; and said second electrical characteristic is said second current through said second layer.

12. The detector of claim 1, wherein: said control circuit comprises a constant current supply, said first current and said second current are each provided by said constant current supply; said first electrical characteristic is the voltage applied in said first mode of operation; and said second electrical characteristic is the voltage applied in said first mode of operation.

13. The detector of claim 1, wherein said control circuit is configured to provide alternating current to said sensor, and said first and second electrical characteristics depend upon electrical impedance of said sensor.

14. A method of detecting the intensity of interactions using a sensor responsive to interactions of varying intensities and comprising a first layer, a second layer and a third layer, wherein said first layer includes a first set of electrically conducting elements which are mutually connected and a second set of electrically conducting elements which are mutually connected, said third layer comprises an electrically conducting plane, and said second layer extends between said first layer and said third layer and the electrical conductivity of said second layer varies in accordance with variations in the intensity of said interactions, wherein said method comprises:

a first mode of operation comprising applying a voltage between said first layer and said third layer to generate a first current through said second layer, and measuring said first current; and a second mode of operation comprising applying a voltage between said first set of electrically conducting elements and said second set of electrically conducting elements to generate a second current through said second layer, and measuring said second current, wherein during operation in said first mode, said sensor is sensitive to an initial first range of intensities of interactions; and during operation in said second mode, said sensor is less sensitive over said first initial range of intensities but provides a varying output over a second range of intensities that is substantially greater than said first range of intensities.

15. The method of claim 14, wherein said interactions are due to the application of mechanical force, the presence of a chemical vapor, the presence of electro-magnetic fields or in response to the presence of ionizing radiation.

16. The method of claim 14, wherein a first layer of said sensor has a first set of conductive elements and a second set of conductive elements interdigitated between said first set of conductive elements, said method including a first mode of operation and a second mode of operation wherein:

in said first mode of operation said first set of conductive elements are electrically connected to said second set of conductive elements to present a unified plane; and in said second mode of operation said first set of conductive elements and said second set of conductive elements are electrically distinct.

17. The method of claim 14, wherein said second layer comprises a quantum tunnelling composite.

18. The method of claim 17, wherein said quantum tunnelling composite is not adhered to said first layer, and, during periods when there is an absence of pressure applied to said second layer, electrical conduction does not occur between said first mutually connected elements and said second mutually connected elements.

19. The method of claim 17, wherein said quantum tunnelling composite is adhered to said first layer, and, during periods when there is an absence of pressure applied to said second layer, a residual current flows between said first mutually connected elements and said second is monitored to provide confirmation to the effect that the sensor is operational.

20. The method of claim 14, wherein method comprises comparing said first current to a first threshold value when operating in said first mode, and changing to said second mode of operation when said measurement of said first current exceeds said first threshold value.

21. The method of claim 14, wherein said method comprises comparing said second current to a second threshold value when operating in said second mode, and changing to said first mode of operation when said second current is less than said second threshold value.

* * * * *